(12) United States Patent
Ooyama et al.

(10) Patent No.: US 11,259,412 B2
(45) Date of Patent: Feb. 22, 2022

(54) THROUGH HOLE FILLING PASTE

(71) Applicant: Ajinomoto Co., Inc., Tokyo (JP)

(72) Inventors: Hideki Ooyama, Kawasaki (JP);
Takayuki Tanaka, Kawasaki (JP);
Eiichi Hayashi, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 17/020,918

(22) Filed: Sep. 15, 2020

(65) Prior Publication Data

US 2020/0413542 A1 Dec. 31, 2020

Related U.S. Application Data

(63) Continuation of application No. PCT/JP2019/008435, filed on Mar. 4, 2019.

(30) Foreign Application Priority Data

Mar. 23, 2018 (JP) .............................. JP2018-056921

(51) Int. Cl.
*H05K 1/09* (2006.01)
*H05K 3/42* (2006.01)
*H05K 1/16* (2006.01)

(52) U.S. Cl.
CPC ............... *H05K 1/165* (2013.01); *H05K 1/09* (2013.01); *H05K 3/42* (2013.01); *H05K 2201/0212* (2013.01); *H05K 2201/0239* (2013.01); *H05K 2201/086* (2013.01)

(58) Field of Classification Search
CPC .. H05K 1/09–097; H05K 1/165; H05K 3/107; H05K 3/42–429
See application file for complete search history.

(56) References Cited

U.S. PATENT DOCUMENTS 6,193,910 B1 2/2001 Ikai et al.
2007/0102663 A1 5/2007 Xiao et al.

FOREIGN PATENT DOCUMENTS

| JP | 2001-203463 A | 7/2001 |
| JP | 2003-257744 A | 9/2003 |
| JP | 2012-069878 A | 4/2012 |
| JP | 2012-227406 A | 11/2012 |
| JP | 2016-100546 A | 5/2016 |
| JP | 2016-197624 A | 11/2016 |

OTHER PUBLICATIONS

International Search Report in PCT/JP2019/008435 dated May 21, 2019.
Extended European Search Report dated Nov. 19. 2021, in European Patent Application No. 19770572.6, filed Mar. 4, 2019 (9 pgs.).

*Primary Examiner* — Jeremy C Norris
(74) *Attorney, Agent, or Firm* — Oblon, McClelland, Maier & Neustadt, L.L.P.

(57) ABSTRACT

Through hole filling pastes which include a magnetic powder (A), an epoxy resin (B), and a curing agent (C), in which the magnetic powder (A) is surface-treated with a surface treating agent containing at least one element selected from Si, Al, and Ti, are capable of achieving a cured product excellent in plating adhesion.

15 Claims, 3 Drawing Sheets

THROUGH HOLE FILLING PASTE

CROSS REFERENCES TO RELATED APPLICATIONS

This application is a continuation of International Patent Application No. PCT/JP2019/008435, filed on Mar. 4, 2019, and claims priority to Japanese Patent Application No. 2018-056921, filed on Mar. 23, 2018, both of which are incorporated herein by reference in their entireties.

BACKGROUND OF THE INVENTION

Field of the Invention

The present invention relates to through hole filling pastes, circuit board in which such a through hole filling paste is used, inductor components, and methods for manufacturing the circuit board.

Discussion of the Background

In recent years, with demands for downsizing and slimming down of electronic devices, downsizing of a circuit board used for electronic devices and high densification of wirings in the circuit board have been required. Such circuit boards are provided with a through hole, and, for the high densification of wirings, it is required that a conductive layer can be formed on the through hole by plating.

For example, Japanese Patent Application Laid-open No. 2016-100546, which is incorporated herein by reference in its entirety, describes a paste containing metal powder, such as copper powder and nickel powder, and a non-conductive filler, such as silica, alumina, iron oxide, and electrolytic iron powder, in order to inhibit thermal expansion and enhance the strength of plating adhesion, and discloses that a through hole is filled with this paste and a portion of the through hole filled with the paste is plated.

For example, Japanese Patent Application Laid-open No. 2012-69878, which is incorporated herein by reference in its entirety, describes a method for enhancing the strength of plating adhesion by filling a through hole with a paste, polishing a cured product of the paste having overflowed the through hole, and then roughening a surface with an oxidizing agent, such as potassium permanganate.

For example, Japanese Patent Application Laid-open No. 2016-197624, which is incorporated herein by reference in its entirety, describes a filling resin containing magnetic substance particles, such as ferric oxide or cobalt ferrite, as a resin with which a through hole in a circuit board for inductor components is filled.

SUMMARY OF THE INVENTION

The inventors found that when a cured product of a magnetic powder-containing paste that has overflowed a through hole is polished, and then, after a surface of the polished cured product is roughened with an oxidizing agent such as potassium permanganate, and plating is performed, the plating adhesion between the cured product and the plating layer is low. In particular, when a paste containing magnetic powder in large amounts, like the resin described in Japanese Patent Application Laid-open No. 2016-197624, which is incorporated herein by reference in its entirety, is used, plating adhesion is lower.

Accordingly, it is one object of the present invention to provide novel through hole filling pastes containing magnetic powder and being capable of offering a cured product excellent in plating adhesion.

It is another object of the present invention to provide novel circuit boards in which such a through hole filling paste is used.

It is another object of the present invention to provide novel inductor components containing such a circuit board.

It is another object of the present invention to provide novel methods for manufacturing such a circuit board.

These and other objects, which will become apparent during the following detailed description, have been achieved by the inventors' discovery that the use of a through hole filling paste containing magnetic powder subjected to treatment with a specific surface treatment agent allows high plating adhesion to be achieved when a cured product of the paste overflowing a through hole is polished, and then a plating layer is formed on the polished surface without a roughening step using an oxidizing agent or the like.

Specifically, the present invention provides the followings:

(1) A through hole filling paste, comprising:
magnetic powder (A);
an epoxy resin (B); and
a curing agent (C), wherein
the magnetic powder (A) is surface treated with a surface treating agent containing at least one element selected from Si, Al, and Ti.

(2) The through hole filling paste according to (1), wherein the surface treatment agent is at least one selected from alkoxy silane, a silane-based coupling agent, an aluminate-based coupling agent, and a titanate-based coupling agent.

(3) The through hole filling paste according to (1) or (2), wherein the magnetic powder (A) is at least one selected from iron oxide powder and iron alloy-based metal powder.

(4) The through hole filling paste according to any one of (1) to (3), wherein the magnetic powder (A) has an average particle diameter of 0.01 µm or larger and 10 µm or smaller.

(5) The through hole filling paste according to any one of (1) to (4), wherein the magnetic powder (A) has an aspect ratio of 2 or less.

(6) The through hole filling paste according to any one of (1) to (5), wherein a content of the magnetic powder (A) is 70% by mass or higher and 98% by mass or lower, with respect to 100% by mass of non-volatile components in the through hole filling paste.

(7) The through hole filling paste according to any one of (1) to (6), wherein the magnetic powder (A) is iron oxide powder, the iron oxide powder being ferrite containing at least one selected from Ni, Cu, Mn, and Zn.

(8) The through hole filling paste according to any one of (1) to (7), wherein the magnetic powder (A) is iron alloy-based metal powder containing at least one selected from Si, Cr, Al, Ni, and Co.

(9) The through hole filling paste according to any one of (1) to (8), wherein the epoxy resin (B) includes an epoxy resin that remains liquid at 25° C.

(10) The through hole filling paste according to any one of (1) to (9), wherein the curing agent (C) is at least one selected from an acid anhydride-based epoxy resin curing agent, an amine-based curing accelerator, and an imidazole-based curing accelerator.

(11) A circuit board, comprising a substrate in which a through hole is filled with a cured product of the through hole filling paste according to any one of (1) to (10).

(12) An inductor component, comprising the circuit board according to (11).

(13) A method for producing a circuit board, the method comprising:

(1) filling a through hole with a through hole filling paste and thermally curing the through hole filling paste to obtain a cured product;

(2) polishing a surface of the cured product; and (3) forming a conductive layer on the polished surface of the cured product, in an order of the step (1), the step (2), and the step (3), wherein the through hole filling paste includes magnetic powder (A), an epoxy resin (B), and a curing agent (C), the magnetic powder (A) being surface-treated with a surface treating agent containing at least one element selected from Si, Al, and Ti.

(14) The method according to (13), wherein the surface treatment agent is at least one selected from alkoxy silane, a silane-based coupling agent, an aluminate-based coupling agent, and a titanate-based coupling agent.

(15) The method according to (13) or (14), not including the roughening the polished surface of the cured product after the step (2) and before the step (3).

Advantageous Effects of Invention

The present invention can provide a through hole filling paste capable of offering a cured product excellent in plating adhesion, a circuit board in which the through hole filling paste is used, an inductor component, and a method for manufacturing the circuit board.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

REFERENCE SIGNS LIST

Figure 1:
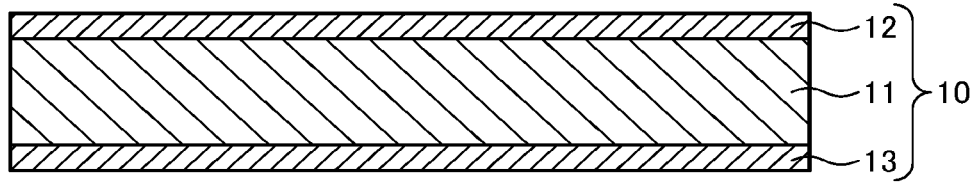
FIG. 1 is a schematic cross-sectional view of a core substrate as an example.

10 core substrate
11 support substrate
12 first metal layer
13 second metal layer
14 through hole
20 plating layer
30a through-hole filling paste
30 cured product layer
40 conductive layer
41 pattern conductive layer

DETAILED DESCRIPTION OF THE PREFERRED EMBODIMENTS

Hereinafter, embodiments of the present invention will be described with reference to the drawings. Note that the drawings just schematically illustrate the shape, size, and arrangement of constituents to the extent of aiding the understanding of the invention. The present invention is not limited by the following descriptions, and constituents may be suitably changed. In the drawings used for the following descriptions, similar constituents are assigned with the same reference sign, and any redundant description may be omitted. Configurations according to the embodiments of the present invention are not necessarily produced or used in accordance with the illustrated arrangement examples.

Through Hole Filling Paste

A through hole filling paste of the present invention contains magnetic powder (A), an epoxy resin (B), and a curing agent (C). The magnetic powder is surface-treated with a surface treating agent containing at least one element selected from Si, Al, and Ti.

In the present invention, the magnetic powder treated with the specific surface treating agent is contained, so that a cured product excellent in plating adhesion can be obtained. Furthermore, the obtained cured product is normally capable of enhancing relative magnetic permeability in a frequency range of 10 to 200 MHz and reducing magnetic loss.

The through hole filling paste may further contain other additives (D), if needed. Hereinafter, components contained in the through hole filling paste of the present invention will be described in detail.

(A) Magnetic Powder

The through hole filling paste contains the magnetic powder (A). Examples of a material of the magnetic powder (A) include pure iron powder; iron oxide powder, such as Mg—Zn-based ferrite, Mn—Zn-based ferrite, Mn—Mg-based ferrite, Cu—Zn-based ferrite, Mg—Mn—Sr-based ferrite, Ni—Zn-based ferrite, Ba—Zn-based ferrite, Ba—Mg-based ferrite, Ba—Ni-based ferrite, Ba—Co-based ferrite, Ba—Ni—Co-based ferrite, Y-based ferrite, ferric oxide powder, and triiron tetraoxide; iron alloy-based metal powder, such as Fe—Si-based alloy powder, Fe—Si—Al-based alloy powder, Fe—Cr-based alloy powder, Fe—Cr—Si-based alloy powder, Fe—Ni—Cr-based alloy powder, Fe—Cr—Al-based alloy powder, Fe—Ni-based alloy powder, Fe—Ni—Mo-based alloy powder, Fe—Ni—Mo—Cu-based alloy powder, Fe—Co-based alloy powder, and Fe—Ni—Co-based alloy powder; and amorphous alloys, such as a Co-group amorphous alloy.

In particular, the magnetic powder (A) is preferably at least one selected from iron oxide powder and iron alloy-based metal powder. The iron oxide powder is preferably ferrite containing at least one selected from Ni, Cu, Mn, and Zn. The iron alloy-based metal powder is preferably iron alloy-based metal powder containing at least one selected from Si, Cr, Al, Ni, and Co.

Commercially available magnetic powder may be used as the magnetic powder (A). Specific examples of the commercially available magnetic powder to be used include PST-S, manufactured by Sanyo Special Steel Co., Ltd; AW2-08, AW2-08PF20F, AW2-08PF10F, AW2-08PF3F, Fe-3.5Si-4.5CrPF20F, Fe-50NiPF20F, and Fe-80Ni-4MoPF20F, manufactured by EPSON ATMIX Corporation; LD-M, LD-MH, KNI-106, KNI-106GSM, KNI-106GS, KNI-109, KNI-109GSM, and KNI-109GS, manufactured by JFE Chemical Corporation; KNS-415, BSF-547, BSF-029, BSN-125, BSN-125, BSN-714, BSN-828, S-1281, S-1641, S-1651, 5-1470, S-1511, and S-2430, manufactured by TODA KOGYO CORP.; JR09P2, manufactured by Japan Metals & Chemicals Co., Ltd; Nanotek, manufactured by CIK Nanotek Corporation; JEMK-S and JEMK-H, manufactured by KINSEI MATEC CO., LTD; and yttrium iron oxide, manufactured by ALDRICH. The magnetic powder may be used alone, or two or more kinds thereof may be used in combination.

The magnetic powder (A) preferably has a spherical shape. A value (an aspect ratio) obtained by dividing the length of the major axis of the magnetic powder by the length of the minor axis of the magnetic powder is preferably 2 or less, more preferably less than 2, still more preferably 1.5 or less, and still more preferably 1.2 or less. Generally, when the magnetic powder has not a spherical shape but a flat shape, relative magnetic permeability can be more easily enhanced. However, to achieve an effect of the present invention by using the epoxy resin (B) and the curing agent (C) in combination, the magnetic powder having a spherical shape is particularly preferably used because, usually, magnetic loss can be reduced and a paste having a desirable viscosity can be achieved.

From the viewpoint of enhancing plating adhesion, the average particle diameter of the magnetic powder (A) is preferably 0.01 µm or larger, more preferably 0.5 µm or larger, and still more preferably 1 µm or larger. In addition, the average particle diameter of the magnetic powder (A) is preferably 10 µm or smaller, more preferably 9 µm or smaller, and still more preferably 8 µm or smaller.

The average particle diameter of the magnetic powder (A) can be measured by laser diffraction scattering based on the Mie scattering theory. Specifically, the average particle diameter can be measured in such a manner that the particle size distribution of the magnetic powder is created on the basis of volume by using a laser diffraction scattering type particle size distribution measurement device, and a median diameter in the particle size distribution is taken as the average particle diameter. As a measurement sample, what is obtained by dispersing the magnetic powder in methyl ethyl ketone by supersonic waves can be preferably used. As the laser diffraction scattering type particle size distribution measurement device, for example, LA-500, manufactured by HORIBA, Ltd. or SALD-2200, manufactured by SHIMADZU CORPORATION can be used.

From the viewpoint of enhancing plating adhesion, the specific surface area of the magnetic powder (A) is preferably 0.05 $m^2$/g or larger, more preferably 0.1 $m^2$/g or larger, and still more preferably 0.3 $m^2$/g or larger. In addition, the specific surface area of the magnetic powder (A) is preferably 10 $m^2$/g or smaller, more preferably 8 $m^2$/g or smaller, and still more preferably 5 $m^2$/g or smaller. The specific surface area of the magnetic powder (A) can be measured by the BET method.

From the viewpoint of enhancing plating adhesion, the magnetic powder (A) is surface-treated with a surface treating agent containing at least one element selected from Si, Al, and Ti. Examples of the surface treating agent include silane-based coupling agents, such as a fluorine-containing silane-based coupling agent, an amino-silane-based coupling agent, an epoxy-silane-based coupling agent, a mercapto-silane-based coupling agent, and an isocyanate-silane-based coupling agent; alkoxy silane; an organosilazane compound; a titanate-based coupling agent; and an aluminate-based coupling agent. From the viewpoint of further enhancing plating adhesion, the surface treating agent is preferably at least one selected from alkoxy silane, a silane-based coupling agent, an aluminate-based coupling agent, and a titanate-based coupling agent, and more preferably at least one selected from alkoxy silane, an aluminate-based coupling agent, and a titanate-based coupling agent.

As the surface treating agent, a commercially available surface treating agent may be used. Examples of the commercially available surface treating agent include KBM403 (3-glycidoxypropyltrimethoxysilane), KBM803 (3-mercaptopropyltrimethoxysilane), KBE903 (3-aminopropyltriethoxysilane), KBM573 (N-phenyl-3-aminopropyltrimethoxysilane), SZ-31 (hexamethyldisilazane), KBM103 (phenyltrimethoxysilane), KBM-4803 (a long-chain epoxy type silane coupling agent), and KBM-7103 (3,3,3-trifluoropropyltrimethoxysilane), manufactured by Shin-Etsu Chemical Co., Ltd; and ALM and TTM, manufactured by Ajinomoto Fine-Techno Co., Inc.

From the viewpoints of enhancing plating adhesion and enhancing dispersibility of the magnetic powder (A), the degree of surface treatment with the surface treating agent is such that preferably 0.01 parts by mass or more, more preferably 0.03 parts by mass or more, and still more preferably 0.05 parts by mass or more of the magnetic powder is surface-treated with respect to 100 parts by mass of the magnetic powder. The upper limit of the degree of the surface treatment is such that preferably 3 parts by mass or less, more preferably 2 parts by mass or less, and still more preferably 1 parts by mass or less of the magnetic powder is surface treated.

The degree of the surface treatment with the surface treating agent can be evaluated by a carbon amount per unit surface area of the magnetic powder (A). From the viewpoint of enhancing the dispersibility of the magnetic powder (A), the carbon amount per unit surface area of the magnetic powder (A) is preferably 0.02 mg/$m^2$ or more, more preferably 0.1 mg/$m^2$ or more, and still more preferably 0.2 mg/$m^2$ or more. On the other hand, from the viewpoint of inhibiting the viscosity of the through hole filling paste from increasing, the carbon amount per unit surface area of the magnetic powder (A) is preferably 1 mg/$m^2$ or less, more preferably 0.8 mg/$m^2$ or less, and still more preferably 0.5 mg/$m^2$ or less.

The carbon amount per unit surface area of the magnetic powder can be measured after the magnetic powder having been subjected to surface treatment with the surface treating agent is washed with a solvent (for example, methyl ethyl ketone (MEK)). Specifically, a sufficient amount of MEK as a solvent is added to the magnetic powder having been surface treated with the surface treating agent, and the resultant mixture is subjected to ultrasonic washing at 25° C. for 5 minutes. After a supernatant liquid is removed and a solid content is dried, the carbon amount per unit surface area of the magnetic powder can be measured with a carbon analyzer. As the carbon analyzer, for example, EMIA-320V, manufactured by HORIBA, Ltd., can be used.

From the viewpoints of enhancing relative magnetic permeability and reducing magnetic loss, the content (% by volume) of the magnetic powder (A) is preferably 10% by volume or higher, more preferably 20% by volume or higher, and still more preferably 30% by volume or higher, with respect to 100% by volume of non-volatile components in the through hole filling paste. In addition, the content of the magnetic powder (A) is preferably 85% by volume or lower, more preferably 75% by volume or lower, and still more preferably 65% by volume or lower.

From the viewpoints of enhancing relative magnetic permeability and reducing magnetic loss, the content (% by mass) of the magnetic powder (A) is preferably 70% by mass or higher, more preferably 73% by mass or higher, and still more preferably 75% by mass or higher, with respect to 100% by mass of non-volatile components in the through hole filling paste. In addition, the content of the magnetic powder (A) is preferably 98° by mass or lower, more preferably 95° by mass or lower, and still more preferably 90% by mass or lower.

(B) Epoxy Resin

The through hole filling paste contains the epoxy resin (B). Examples of the epoxy resin (B) include a bisphenol A epoxy resin; a bisphenol F epoxy resin; a bisphenol S epoxy resin; a bisphenol AF epoxy resin; a dicyclopentadiene epoxy resin; a trisphenol epoxy resin; a phenol novolac epoxy resin; a tert-butyl-catechol epoxy resin; epoxy resins having a condensed ring structure, such as a naphthol novolac epoxy resin, a naphthalene epoxy resin, a naphthol epoxy resin, and an anthracene epoxy resin; a glycidyl amine epoxy resin; a glycidyl ester epoxy resin; a cresol novolac epoxy resin; a biphenyl epoxy resin; a linear aliphatic epoxy resin; an epoxy resin having a butadiene structure; an alicyclic epoxy resin; a heterocyclic epoxy resin; a Spiro ring-containing epoxy resin; a cyclohexane dimethanol epoxy resin; a trimethylol epoxy resin; and a tetraphenyl ethane epoxy resin. The epoxy resins may be used alone or two or more kinds thereof may be used in combination. The epoxy resin (B) is preferably at least one selected from a bisphenol A epoxy resin and a bisphenol F epoxy resin.

The epoxy resin (B) preferably includes an epoxy resin having two or more epoxy groups in one molecule. The epoxy resin (B) preferably has an aromatic structure, and, in the case where the epoxy resin (B) includes two or more kinds of epoxy resins, at least one of the epoxy resins more preferably has an aromatic structure. The aromatic structure is a chemical structure generally defined as aromatic series, and includes polycyclic aromatic series and heteroaromatic rings. The ratio of an epoxy resin having two or more epoxy groups in one molecule is preferably 50% by mass or higher, more preferably 60% by mass or higher, and still more preferably 70% by mass or higher with respect to 100% by mass of non-volatile components of epoxy resins.

Epoxy resin includes an epoxy resin that remains liquid at a temperature of 25° C. (hereinafter, sometimes referred to as "the liquid epoxy resin") and an epoxy resin that remains solid at a temperature of 25° C. (hereinafter, sometimes referred to as "the solid epoxy resin"). The through hole filling paste may contain only the liquid epoxy resin or may contain only the solid epoxy resin, as the epoxy resin (B), but, from the viewpoints of lowering the viscosity of the through hole filling paste and thereby filling the through hole more easily, the through hole filling paste preferably contains the liquid epoxy resin.

The liquid epoxy resin is preferably a bisphenol A epoxy resin, a bisphenol F epoxy resin, a bisphenol AF epoxy resin, a naphthalene epoxy resin, a glycidyl ester epoxy resin, a glycidyl amine epoxy resin, a phenol novolac epoxy resin, a cycloaliphatic epoxy resin having an ester skeleton, a cyclohexanedimethanol epoxy resin, or an epoxy resin having a butadiene structure, and more preferably a glycidyl amine epoxy resin, a bisphenol A epoxy resin, a bisphenol F epoxy resin, a bisphenol AF epoxy resin, or a naphthalene epoxy resin. Specific examples of the liquid epoxy resin include HP4032, HP4032D, and HP4032SS (naphthalene epoxy resins), manufactured by DIC Corporation; 828US and jER828EL (bisphenol A epoxy resins), jER807 (a bisphenol F epoxy resin), and jER152 (a phenol novolac epoxy resin), manufactured by Mitsubishi Chemical Corporation; 630 and 630LSD, manufactured by Mitsubishi Chemical Corporation, and EP-3980S, manufactured by ADEKA Corporation, (glycidyl amine epoxy resins); ZX1059 (a mixed product of a bisphenol A epoxy resin and a bisphenol F epoxy resin), manufactured by Nippon Steel & Sumikin Chemical Co., Ltd.; EX-721 (a glycidyl ester epoxy resin), manufactured by Nagase ChemteX Corporation; Celloxide 2021P (a cycloaliphatic epoxy resin having an ester skeleton) and PB-3600 (an epoxy resin having a butadiene structure), manufactured by Daicel Corporation; and ZX1658 and ZX1658GS (liquid 1,4-glycidyl cyclohexane), manufactured by NIPPON STEEL Chemical & Material Co., Ltd. These liquid epoxy resins may be used alone or two or more kinds thereof may be used in combination.

The solid epoxy resin is preferably a naphthalene tetrafunctional epoxy resin, a cresol novolac epoxy resin, a dicyclopentadiene epoxy resin, a trisphenol epoxy resin, a naphthol epoxy resin, a biphenyl epoxy resin, a naphthylene ether epoxy resin, an anthracene epoxy resin, a bisphenol A epoxy resin, or a tetraphenylethane epoxy resin, and more preferably a naphthalene tetrafunctional epoxy resin, a naphthol epoxy resin, or a biphenyl epoxy resin. Specific examples of the solid epoxy resin include HP4032H (a naphthalene epoxy resin), HP-4700 and HP-4710 (naphthalene tetrafunctional epoxy resins), N-690 (a cresol novolac epoxy resin), N-695 (a cresol novolac epoxy resin), HP-7200, HP-7200H, and HP-7200HH (dicyclopentadiene epoxy resins), EXA-7311, EXA-7311-G3, EXA-7311-G4, EXA-7311-G4S, and HP6000 (naphtylene ether epoxy resins), manufactured by DIC Corporation; EPPN-502H (a trisphenol epoxy resin), NC7000L (a naphthol novolac epoxy resin), NC3000H, NC3000, NC3000L, and NC3100 (biphenyl epoxy resins), manufactured by Nippon Kayaku Co., Ltd.; ESN475V (a naphthalene epoxy resin) and ESN485 (a naphthol novolac epoxy resin), manufactured by Nippon Steel & Sumikin Chemical Co., Ltd.; YX4000H and YL6121 (biphenyl epoxy resins), YX4000HK (a bixylenol epoxy resin), and YX8800 (an anthracene epoxy resin), manufactured by Mitsubishi Chemical Corporation; PG-100 and CG-500, manufactured by Osaka Gas Chemicals Co., Ltd., and YL7760, manufactured by Mitsubishi Chemical Corporation (bisphenol AF epoxy resins), and YL7800 (a fluorene epoxy resin), jER1010 (a solid bisphenol A epoxy resin), and jER1031S (a tetraphenylethane epoxy resin), manufactured by Mitsubishi Chemical Corporation. These solid epoxy resins may be used alone or two or more kinds thereof may be used in combination.

When a liquid epoxy resin and a solid epoxy resin are used in combination as the epoxy resin (B), the mass ratio of these epoxy resins (liquid epoxy resin:solid epoxy resin) preferably falls within a range of 1:0.1 to 1:4. When the mass ratio of the liquid epoxy resin to the solid epoxy resin falls within the above-mentioned range, for example, the effect of achieving a cured product having sufficient breaking strength can be produced. From the viewpoint of the above-mentioned effect, the mass ratio of the liquid epoxy resin to the solid epoxy resin (liquid epoxy resin:solid epoxy resin) falls within preferably a range of 1:0.3 to 1:3.5, more preferably a range of 1:0.6 to 1:3, and still more preferably a range of 1:0.8 to 1:2.5.

From the viewpoint of achieving a magnetic layer excellent in mechanical strength and insulation reliability, the content of the epoxy resin (B) is preferably 1% by mass or higher, more preferably 3% by mass or higher, and still more preferably 5% by mass or higher, with respect to 100% by mass of non-volatile components in the through-hole filling paste. The upper limit of the content of the epoxy resin is not limited to a particular content as long as the effect of the present invention is achieved, but, is preferably 30% by mass or lower, more preferably 25% by mass or lower, and still more preferably 20% by mass or lower.

The content (% by volume) of the epoxy resin (B) is preferably 1% by volume or higher, more preferably 3% by volume or higher, and still more preferably 5% by volume or higher, with respect to 100% by volume of non-volatile components in the through hole filling paste. The upper limit of the content of the epoxy resin is not limited to a particular content as long as the effect of the present invention is achieved, but, is preferably 25% by volume or lower, more preferably 20% by volume or lower, and still more preferably 15% by volume or lower.

The epoxy equivalent of the epoxy resin (B) is preferably 50 to 5000, more preferably 50 to 3000, still more preferably 80 to 2000, and still more preferably 110 to 1000. When the epoxy equivalent is within the above-mentioned range, the crosslinking density of the cured product is sufficient, whereby a magnetic layer having lower surface roughness can be offered. Note that the epoxy equivalent can be measured in accordance with JIS K7236, and is the mass of a resin containing one equivalent of epoxy group.

The weight-average molecular weight of the epoxy resin (B) is preferably 100 to 5000, more preferably 250 to 3000, and still more preferably 400 to 1500. Here, the weight-average molecular weight of the epoxy resin is a weight-average molecular weight in terms of polystyrene, measured by gel permeation chromatography (CPC).

(C) Curing Agent

The through hole filling paste contains the curing agent (C). As the curing agent (C), there are an epoxy resin curing agent having the function of curing an epoxy resin and a curing accelerator having the function of accelerating the curing rate of an epoxy resin. The through hole filling paste preferably contains any of an epoxy resin curing agent and a curing accelerator, as the curing agent (C), and more preferably contains a curing accelerator.

Epoxy Resin Curing Agent

Examples of the epoxy resin curing agent include an acid anhydride-based epoxy resin curing agent, a phenol-based epoxy resin curing agent, a naphthol-based epoxy resin curing agent, an active ester-based epoxy resin curing agent, a benzoxazine-based epoxy resin curing agent, and a cyanate ester-based epoxy resin curing agent. From the viewpoint of lowering the viscosity of the through hole filling paste, the epoxy resin curing agent is preferably an acid anhydride-based epoxy resin curing agent. The epoxy resin curing agent may be used alone or two or more kinds thereof may be used in combination.

Examples of the acid anhydride-based epoxy resin curing agent include an epoxy resin curing agent having one or more acid anhydride groups in one molecule. Specific example of the acid anhydride-based epoxy resin curing agent include phthalic anhydride, tetrahydrophthalic anhydride, hexahydrophthalic anhydride, methyltetrahydrophthalic anhydride, methylhexahydrophthalic anhydride, methyl nadic anhydride, hydrogenated methyl nadic anhydride, trialkyltetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, pyromellitic anhydride, benzophenone tetracarboxylic dianhydride, biphenyl tetracarboxylic dianhydride, naphthalene tetracarboxylic dianhydride, oxydiphthalic dianhydride, 3,3'-4,4'-diphenylsulfone tetracarboxylic dianhydride, 1,3,3a,4,5,9b-hexahydro-5-(tetrahydro-2,5-dioxo-3-furanyl)-naphto[1,2-C]furan-1,3-dione, ethylene glycol bis(anhydrotrimellitate), and an acid anhydride polymer such as a styrene-maleic acid resin obtained by copolymerization of styrene and maleic acid.

Examples of a commercially available acid anhydride-based epoxy resin curing agent include HNA-100 and MH-700, manufactured by New Japan Chemical Co., Ltd.

From the viewpoints of heat-resistance and water-resistance, the phenol-based epoxy resin curing agent and the naphthol-based epoxy resin curing agent are preferably a phenol-based epoxy resin curing agent having a novolac structure or a naphthol-based epoxy resin curing agent having a novolac structure. The phenol-based epoxy resin curing agent is preferably a nitrogen-containing phenol-based epoxy resin curing agent, more preferably a triazine skeleton-containing phenol-based epoxy resin curing agent, and still more preferably a triazine skeleton-containing phenol novolac epoxy resin curing agent.

Specific examples of the phenol-based epoxy resin curing agent and the naphthol-based epoxy resin curing agent include MEH-7700, MEH-7810, and MEH-7851, manufactured by Meiwa Plastic Industries, Ltd., NHN, CBN, and GPH, manufactured by Nippon Kayaku Co., Ltd., SN170, SN180, SN190, SN475, SN485, SN495V, SN375, and SN395, manufactured by Nippon Steel & Sumikin Chemical Co., Ltd., TD-2090, LA-7052, LA-7054, LA-1356, LA-3018-50P, EXB-9500, HPC-9500, KA-1160, KA-1163, and KA-1165, manufactured by DIC Corporation, and GDP-6115L and GDP-6115H, manufactured by Gun-Ei Chemical Industry Co., Ltd.

The active ester-based epoxy resin curing agent is, but not particularly limited to, generally preferably a compound having two or more highly reactive ester groups in one molecule, such as phenol esters, thiophenol esters, N-hydroxyamine esters, and esters of heterocyclic hydroxy compounds. The active ester-based epoxy resin curing agent is preferably obtained by condensation reaction of a carboxylic acid compound and/or a thiocarboxylic acid compound with a hydroxy compound and/or a thiol compound. In particular, from the viewpoint of enhancing heat resistance, the active ester-based epoxy resin curing agent is preferably an active ester-based epoxy resin curing agent obtained from a carboxylic acid compound and a hydroxy compound, and more preferably an active ester-based epoxy resin curing agent obtained from a carboxylic acid compound and a phenol compound and/or naphthol compound. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound and the naphthol compound include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene diphenol compound, and phenol novolac. Here, the dicyclopentadiene diphenol compound is a diphenol compound obtained by condensation of two molecules of phenol and one molecule of dicyclopentadiene.

Specifically, an active ester-based epoxy resin curing agent having a dicyclopentadiene diphenol structure, an active ester-based epoxy resin curing agent having a naphthalene structure, an active ester-based epoxy resin curing agent containing acetylated phenol novolac, and an active ester-based epoxy resin curing agent containing benzoylated phenol novolac are preferable. The dicyclopentadiene diphenol structure is a divalent structure composed of phenylene-dicyclopentylene-phenylene.

Examples of a commercially available active ester-based epoxy resin curing agent include EXB9451, EXB9460, EXB9460S, HPC-8000-65T, HPC-8000H-65TM, and EXB-8000L-65TM, manufactured by DIC Corporation, as the active ester-based epoxy resin curing agent having a dicyclopentadiene diphenol structure; EXB9416-70BK, manufactured by DIC Corporation, as the active ester compound having a naphthalene structure; DC808, manufactured by Mitsubishi Chemical Corporation, as the active ester-based epoxy resin curing agent containing acetylated phenol novolac; YLH1026, YLH1030, and YLH1048, manufactured by Mitsubishi Chemical Corporation, as the active ester-based epoxy resin curing agent containing benzoylated phenol novolac; and DC808, manufactured by Mitsubishi Chemical Corporation, as the active ester-based epoxy resin curing agent containing acetylated phenol novolac.

Specific examples of the benzoxazine-based epoxy resin curing agent include HFB2006M, manufactured by Showa Highpolymer Co., Ltd., and P-d and F-a, manufactured by SHIKOKU CHEMICALS CORPORATION.

Examples of the cyanate ester-based epoxy resin curing agent include difunctional cyanate resins, such as bisphenol A dicyanate, polyphenol cyanate, oligo (3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; polyfunctional cyanate resins derived from, for example, phenol novolac and cresol novolac; and prepolymers in which these cyanate esters are partially triazinized. Specific examples of the cyanate ester-based epoxy resin curing agent include PT30 and PT60 (both are phenol novolac polyfunctional cyanate ester resins) and BA230 and BA230S75 (prepolymers in which bisphenol A dicyanate is partially or entirely triazinized to form a trimer), manufactured by Lonza Japan Ltd.

The amount ratio of an epoxy resin to an epoxy resin curing agent is the ratio of [the total number of epoxy groups in the epoxy resin]: [the total number of reactive groups in the epoxy resin curing agent], and is preferably in a range of 1:0.2 to 1:2, more preferably in a range of 1:0.3 to 1:1.5, and still more preferably in a range of 1:0.4 to 1:1. Here, the reaction groups of the epoxy resin curing agent are, for example, an active hydroxyl group and an active ester group, and are different depending on the kind of the epoxy resin curing agent. The total number of epoxy groups in the epoxy resin is a value obtained by dividing the mass of non-volatile components in the epoxy resins by respective epoxy equivalents and summing the resulting values for all the epoxy resins. The total number of reactive groups in the epoxy resin curing agent is a value obtained by dividing the mass of non-volatile components in the epoxy resin curing agents by respective reactive group equivalents and summing the resulting values for all the epoxy resin curing agents. When the amount ratio of the epoxy resin to the epoxy resin curing agent is in the above-mentioned range, a resulting cured product has higher heat-resistance.

Curing Accelerator

Examples of the curing accelerator include an amine-based curing accelerator, an imidazole-based curing accelerator, a phosphorus-based curing accelerator, a guanidine-based curing accelerator, and a metal-based curing accelerator. From the viewpoint of lowering the viscosity of the through hole filling paste, the curing accelerator is preferably an amine-based curing accelerator or an imidazole-based curing accelerator. The curing accelerator may be used alone or two or more kinds thereof may be used in combination.

Examples of the amine-based curing accelerator include trialkylamines such as triethylamine and tributylamine, 4-dimethylaminopyridine, benzyldimethylamine, 2,4,6-tris(dimethylaminomethyl)phenol, and 1,8-diazabicyclo(5,4,0)-undecene. The amine-based curing accelerator is preferably 4-dimethylaminopyridine or 1,8-diazabicyclo(5,4,0)-undecene.

As the amine-based curing accelerator, a commercially available amine-based curing accelerator may be used, and examples thereof include PN-50, PN-23, and MY-25, manufactured by Ajinomoto Fine-Techno Co., Inc.

Examples of the imidazole-based curing accelerator include imidazole compounds, such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline; and an adduct of an imidazole compound and an epoxy resin. The imidazole-based curing accelerator is preferably 2-ethyl-4-methylimidazole or 1-benzyl-2-phenylimidazole.

As the imidazole-based curing accelerator, a commercially available imidazole-based curing accelerator may be used, and examples thereof include 2PHZ-PW, manufactured by SHIKOKU CHEMICALS CORPORATION, and P200-H50, manufactured by Mitsubishi Chemical Corporation.

Examples of the phosphorus-based curing accelerator include triphenylphosphine, a phosphonium borate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate. The phosphorus-based curing accelerator is preferably triphenylphosphine or tetrabutylphosphonium decanoate.

Examples of the guanidine-based curing accelerator include dicyandiamide, 1-methylguanidine, 1-ethylguanidine, 1-cyclohexylguanidine, 1-phenylguanidine, 1-(o-tolyl) guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl) biguanide. The guanidine-based curing accelerator is preferably dicyandiamide or 1,5,7-triazabicyclo[4.4.0]dec-5-ene.

Examples of the metal-based curing accelerator include organic metal complexes and organic metal salts of metals such as cobalt, copper, zinc, iron, nickel, manganese, and tin. Specific examples of the organic metal complex include organic cobalt complexes, such as cobalt (II) acetylacetonate and cobalt (III) acetylacetonate, an organic copper complex such as copper (II) acetylacetonate, an organic zinc complex such as zinc (II) acetylacetonate, an organic iron complex such as iron (III) acetylacetonate, an organic nickel complex such as nickel (II) acetylacetonate, and an organic manganese complex such as manganese (II) acetylacetonate. Examples of the organic metal salt include zinc octoate, tin octoate, zinc naphthenate, cobalt naphthenate, tin stearate, and zinc stearate.

From the viewpoint of achieving a desired effect of the present invention, the curing agent (C) is preferably at least one selected from the acid anhydride-based epoxy resin curing agent, the amine-based curing accelerator, and the imidazole-based curing accelerator, and more preferably at least one selected from the amine-based curing accelerator and the imidazole-based curing accelerator.

From the viewpoint of lowering the viscosity of the through hole filling paste, the content of the curing accelerator is preferably 1% by mass or higher, more preferably 3% by mass or higher, and still more preferably 5% by mass or higher, and the upper limit thereof is preferably 20% by mass or lower, more preferably 15% by mass or lower, and still more preferably 10% by mass or lower, with respect to 100% by mass of resin components in the through hole filling paste. The resin components are non-volatile components contained in the through hole filling paste except the magnetic powder and a later-mentioned inorganic filler.

The content of the curing agent (C) is preferably 0.1% by mass or higher, more preferably 0.3% by mass or higher, and still more preferably 0.5% by mass or higher with respect to 100% by mass of non-volatile components in the through-hole filling paste. The upper limit of the content of the curing agent (C) is preferably 20% by mass or lower, more preferably 15% by mass or lower, and still more preferably 10% by mass or lower.

(D) Other Additives

The through hole filling paste may further contain other additives (D), if needed. Examples of the other additives include a curing retardant, such as triethyl borate, to enhance a pot life, an inorganic filler (except an inorganic filler equivalent to the magnetic powder), a thermoplastic resin, a fire retardant, an organic filler, organometallic compounds, such as an organocopper compound, an organozinc compound, and an organocobalt compound, and resin additives, such as a thickener, a defoaming agent, a leveling agent, an adhesion imparting agent, and a colorant.

The content of the organic solvent in the above-mentioned through hole filling paste is preferably less than 1.0% by mass, more preferably 0.8% by mass or lower, still more preferably 0.5% by mass or lower, and particularly preferably 0.1% by mass or lower, with respect to the total mass of the through hole filling paste. The lower limit of the content of the organic solvent is not particularly limited, but is 0.001% by mass or higher, or alternatively the through hole filling paste does not contain the organic solvent. Even the through hole filling paste does not contain any organic solvent, the viscosity of the through hole filling paste can be made lower. When the through hole filling paste contains the organic solvent in smaller amounts, occurrence of a void due to volatilization of the organic solvent can be prevented.

Method for Producing Through Hole Filling Paste

The through hole filling paste can be produced, for example, by stirring blending components with a stirrer, such as a three-roll mill or a rotary mixer.

Physical Properties and Other Properties of Through Hole Filling Paste

The through hole filling paste is usually in a paste form at an appropriate temperature even when not containing a solvent. Specifically, the viscosity of the through hole filling paste is usually 20 Pa·s or higher at 25° C., preferably 40 Pa·s or higher, and more preferably 60 Pa·s or higher, and usually 200 Pa·s or lower, preferably 180 Pa·s or lower, and more preferably 160 Pa·s or lower. The viscosity can be measured in such a manner that, for example, approximately 0.2 mL of the paste is injected using a syringe to an E-type viscometer (RE-80, manufactured by TOKI SANGYO CO., LTD.) adjusted at 25° C., and the viscosity is measured using the E-type viscometer at a rotation speed of 0.5 rpm to 5 rpm.

A cured product obtained by thermally curing the through hole filling paste (for example, a cured product obtained by thermally curing at 180° C. for 90 minutes) has a characteristic of high relative magnetic permeability at a frequency of 100 MHz. For example, the through hole filling paste in a sheet form is subjected to thermally curing at 180° C. for 90 minutes to obtain a cured product in a sheet form. The relative magnetic permeability of this cured product at a frequency of 100 MHz is preferably 3 or higher, more preferably 4 or higher, and still more preferably 5 or higher. The upper limit of the relative magnetic permeability is not particularly limited, but may be 20 or lower, for example.

A cured product obtained by thermally curing the through hole filling paste (for example, the cured product obtained by thermally curing at 180° C. for 90 minutes) has a characteristic of smaller magnetic loss at a frequency of 100 MHz. For example, the through hole filling paste in a sheet form is subjected to thermally curing at 180° C. for 90 minutes to obtain a cured product in a sheet form. The magnetic loss of this cured product at a frequency of 100 MHz is preferably 0.05 or smaller, more preferably 0.04 or smaller, and still more preferably 0.03 or smaller. The lower limit of the magnetic loss is not particularly limited, but may be 0.0001 or larger.

A cured product obtained by heating the through hole filling paste at 130° C. for 30 minutes and further heating at 150° C. for 30 minutes has a characteristic of being excellent in plating adhesion to a plating layer. The adhesion strength, which indicates plating adhesion, is preferably 0.15 kgf/cm or higher, more preferably 0.2 kgf/cm or higher, and still more preferably 0.3 kgf/cm or higher. The upper limit of the adhesion strength is not particularly limited, but may be 10 kgf/cm or lower. The adhesion strength can be measured by a method described in the later-mentioned examples.

Circuit Board and Manufacturing Method of Same

A circuit board includes a substrate in which a through hole is filled with a cured product of the through hole filling paste of the present invention.

A conventional circuit board is usually manufactured by a manufacturing method including the following steps (a) to (d). The manufacturing method includes the steps of:

(a) filling a through hole with the through hole filling paste and thermally curing the through hole filling paste to obtain a cured product;

(b) polishing a surface of the cured product;

(c) roughening the polished surface; and (d) forming a conductive layer in the roughened surface, in this order.

Usually, the step (c) is conducted from the viewpoint of enhancing plating adhesion between the cured product and plating. However, the cured product of the through hole filling paste containing the surface-treated magnetic powder has poor chemical agent resistance against a roughening agent to be used for roughening, and accordingly is inferior in plating adhesion after roughening.

In contrast, the circuit board of the present invention is produced by a manufacturing method including the following steps (1) to (3). The manufacturing method includes the steps of:

(1) filling a through hole with the through-hole filling paste and thermally curing the through hole filling paste to obtain a cured product;

(2) polishing a surface of the cured product; and (3) forming a conductive layer in the polished surface, in this order.

The inventors found that, at the step (1), the through hole filling paste containing the magnetic powder having been surface-treated with the surface treating agent is used, and furthermore, before the step (2) and after the step (3), the step of roughening the polished surface of the cured product is not conducted, so that plating adhesion between the cured product and plating is enhanced, and thus the present invention has been completed. As described above, the roughening is usually conducted from the viewpoint of enhancing plating adhesion, but, according to the present invention, plating adhesion can be enhanced without conducting the roughening.

Hereinafter, the above-described steps (1) to (3) for manufacturing the circuit board will be described in detail.

Step (1)

The step (1) may include the step of preparing the through hole filling paste. The through hole filling paste is as described above.

The step (1) may include the step of preparing a core substrate 10 including a support substrate 11, a first metal layer 12, and a second metal layer 13, the first metal layer 12 and the second metal layer 13 being provided in both surfaces of the support substrate 11 respectively and formed of, for example, copper foil, as illustrated in an example of FIG. 1. Examples of a material of the support substrate 11 include a glass epoxy substrate, a metal substrate, a polyester substrate, a polyimide substrate, a BT resin substrate, and a thermosetting polyphenylene ether substrate. Examples of a material of the first and the second metal layers include a copper foil with carrier and a material of a later-mentioned conductive layer.

Figure 2:
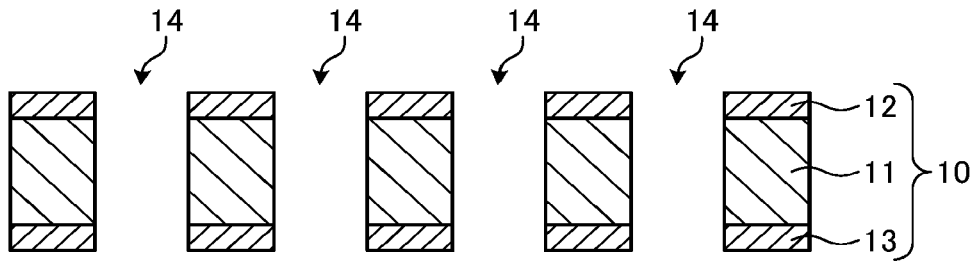
FIG. 2 is a schematic cross-sectional view of the core substrate having a through hole formed therein, as an example.

As illustrated in an example in FIG. 2, the step (1) may include the step of forming a through hole 14 in the core substrate 10. The through hole 14 can be formed by, for example, drilling, laser irradiation, or plasma irradiation.

Specifically, the through hole 14 can be formed in such a manner that a through hole is formed in the core substrate 10 by drilling, for example.

The formation of the through hole 14 can be performed using a commercially available drilling apparatus. Examples of the commercially available drilling apparatus include ND-1S211, manufactured by Hitachi Via Mechanics, Ltd.

Figure 3:
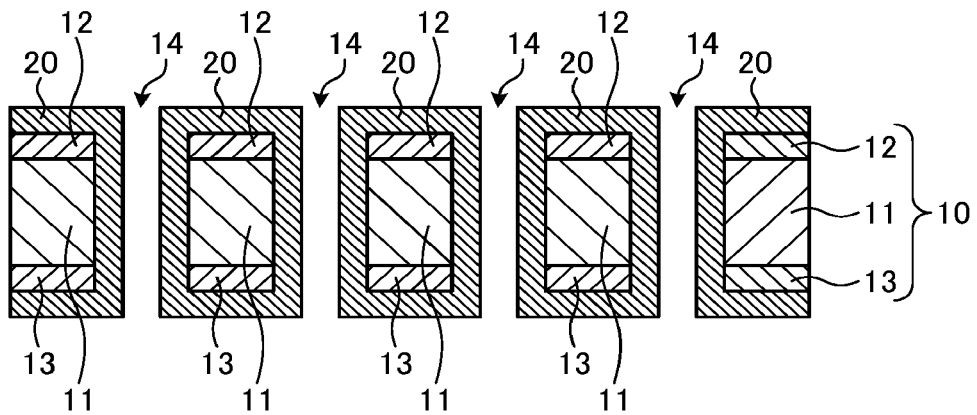
FIG. 3 is a schematic cross-sectional view illustrating a state in which a plating layer is formed in the through hole, as an example.

After the formation of the through hole 14 in the core substrate 10, the step (1) may include the step of roughening the core substrate 10 and forming a plating layer 20 inside the through hole 14, on a surface of the first metal layer 12, and on a surface of the second metal layer 13, as illustrated in an example in FIG. 3.

As the above-described roughening, any of dry roughening and wet roughening may be performed. Examples of the dry roughening include plasma processing. Examples of the wet roughening include a method in which swelling treatment with a swelling solution, roughening treatment with an oxidant, and neutralization treatment with a neutralization solution are performed in this order.

The plating layer 20 is formed by plating. A procedure for forming the plating layer 20 by the plating is the same as that for forming a conductive layer at the step (3) described later.

Figure 4:
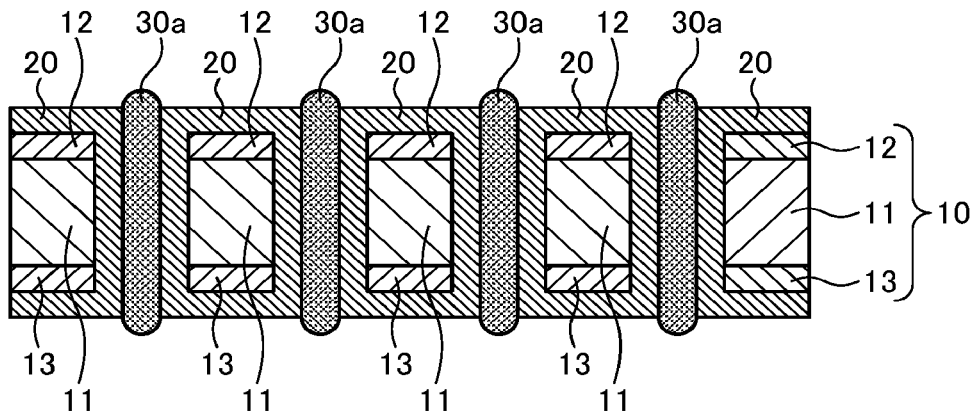
FIG. 4 is a schematic cross-sectional view illustrating a state in which the through hole is filled with a through hole filling paste, as an example.

After preparing the core substrate 10 having the plating layer 20 formed inside the through hole 14, the through hole 14 is filled with a through hole filling paste 30a, as illustrated in an example in FIG. 4. Examples of a filling method include a method of filling the through hole 14 with the through hole filling paste 30a via a squeegee, a method of filling with the through hole filling paste 30a via a cartridge, a method of filling with the through hole filling paste 30a by mask printing, a roll coating method, and an inkjet method.

Figure 5:
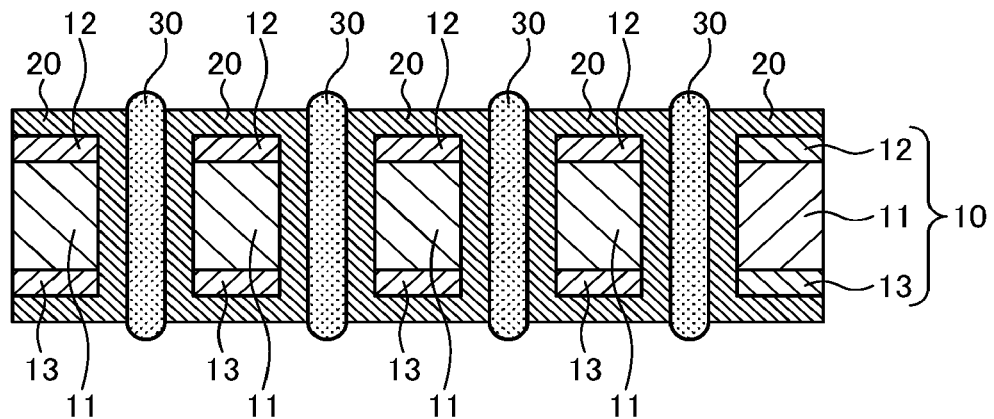
FIG. 5 is a schematic cross-sectional view illustrating the state of a cured product obtained by heat-curing the filled through-hole filling paste, as an example.

After the through hole 14 is filled with the through hole filling paste 30a, the through hole filling paste 30a is thermally cured to form a cured product layer 30 in the through hole 14, as illustrated in an example in FIG. 5. Conditions for thermally curing the through hole filling paste 30a are different in accordance with a composition and a kind of the through hole filling paste 30a, but the curing temperature is preferably 120° C. or higher, more preferably 130° C. or higher, and still more preferably 150° C. or higher, and preferably 240° C. or lower, more preferably 220° C. or lower, and still more preferably 200° C. or lower. Time to cure the through hole filling paste 30a is preferably 5 minutes or longer, more preferably 10 minutes or longer, and still more preferably 15 minutes or longer, and preferably 120 minutes or shorter, more preferably 100 minutes or shorter, and still more preferably 90 minutes or shorter.

The degree of cure of the cured product layer 30 at the step (1) is preferably 80% or higher, more preferably 85% or higher, and still more preferably 90% or higher. The degree of cure can be measured, for example, using a differential scanning calorimeter.

Prior to the thermally curing of the through hole filling paste 30a, the through hole filling paste 30a may be subjected to preheating treatment to be heated at a temperature lower than the curing temperature. For example, prior to the thermally curing of the through hole filling paste 30a, the through hole filling paste 30a may be preheated, normally at a temperature of 50° C. or higher and less than 120° C. (preferably 60° C. or higher and 110° C. or lower, and more preferably 70° C. or higher and 100° C. or lower), normally for 5 minutes or longer (preferably for 5 minutes to 150 minutes, and more preferably for 15 minutes to 120 minutes).

Step (2)

Figure 6:
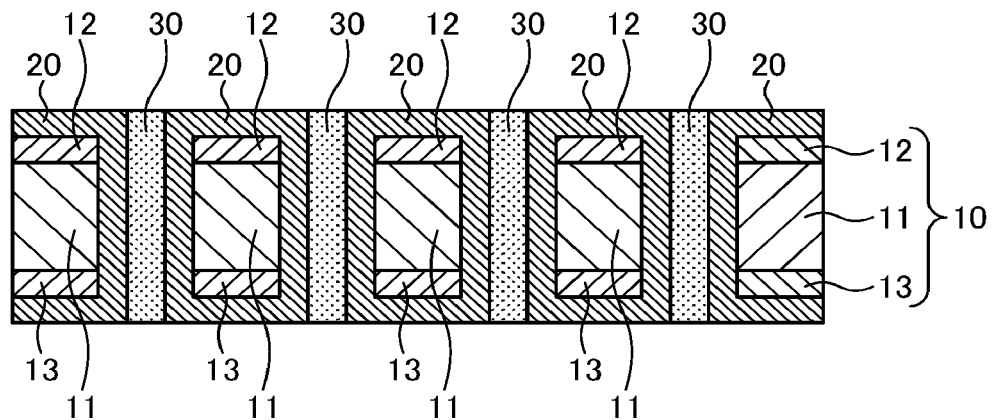
FIG. 6 is a schematic cross-sectional view illustrating a state observed after the polishing of the cured product, as an example.

At the step (2), as illustrated in an example in FIG. 6, an excessive cured product layer 30 protruding from or adhering to the core substrate 10 is removed by polishing to planarize the surface. As a method for the polishing, use can be made of a method capable of polishing the excessive cured product layer 30 protruding from or adhering to the core substrate 10. Examples of the method for the polishing include buffing and belt polishing. Examples of a commercially available buffing apparatus include NT-700IM, manufactured by ISHIIHYOKI CO., LTD.

From the viewpoint of enhancing plating adhesion, the arithmetic mean roughness (Ra) of the polished surface of the cured product layer is preferably 300 nm or more, more preferably 350 nm or more, and still more preferably 400 nm or more. The upper limit is preferably 1000 nm or less, more preferably 900 nm or less, and still more preferably 800 nm or less. The surface roughness (Ra) can be measured, for example, using a non-contact type surface roughness meter.

For the purpose of, for example, further enhancing the degree of cure of the cured product layer, thermally treatment may be performed, if needed after the step (2) and before the step (3). The temperature for the thermally treatment is in accordance with the above-described curing temperature, preferably 120° C. or higher, more preferably 130° C. or higher, and still more preferably 150° C. or higher, and preferably 240° C. or lower, more preferably 220° C. or lower, and still more preferably 200° C. or lower. Time for the thermally treatment is preferably 5 minutes or longer, more preferably 10 minutes or longer, and still more preferably 15 minutes or longer, and preferably 90 minutes or shorter, more preferably 70 minutes or shorter, and still more preferably 60 minutes or shorter.

Step (3)

Figure 7:
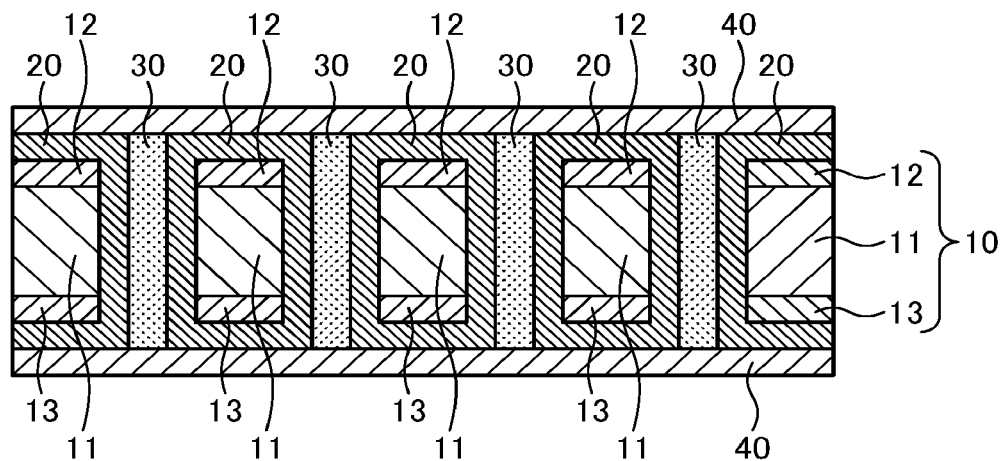
FIG. 7 is a schematic cross-sectional view illustrating a state in which a conductive layer is formed on a polished surface, as an example.
Figure 8:
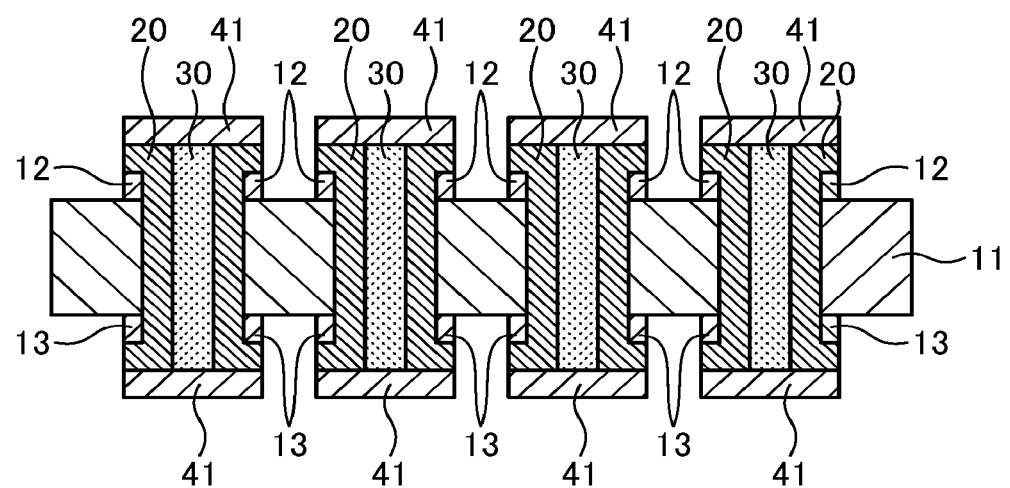
FIG. 8 is a schematic cross-sectional view illustrating a state in which a pattern conductive layer is formed, as an example.

At the step (3), a conductive layer 40 is formed on the polished surface of the cured product layer 30 and the plating layer 20, as illustrated in an example in FIG. 7. Furthermore, after the formation of the conductive layer 40, the conductive layer 40, the first metal layer 12, the second metal layer 13, and the plating layer 20 may be partially removed by a treatment such as etching to form a pattern conductive layer 41, as illustrated in an example in FIG. 8. As described above, the present invention does not include the step of roughening the polished surface of the cured product after the step (2) and before the step (3). In FIG. 7, the conductive layer 40 is formed on both surfaces of the core substrate 10, but, the conductive layer 40 may be formed on only one surface of the core substrate 10.

Examples of a method for forming the conductive layer include plating, sputtering, and vapor deposition. Among these methods, plating is preferably used. In a preferable embodiment, a surface of the cured product is subjected to plating with an appropriate method, such as a semi-additive method or a full-additive method, to form a pattern conductive layer having a desired wiring pattern. Examples of a material of the conductive layer include single metals, such as gold, platinum, palladium, silver, copper, aluminum, cobalt, chromium, zinc, nickel, titanium, tungsten, iron, tin, and indium; and alloys of two or more kinds of metals selected from the group consisting of gold, platinum, palladium, silver, copper, aluminum, cobalt, chromium, zinc, nickel, titanium, tungsten, iron, tin, and indium. Among these metals, from the viewpoints of for example, versatility, cost, and ease of patterning, chromium, nickel, titanium, aluminum, zinc, gold, palladium, silver, copper, a nickel-chrome alloy, a copper-nickel alloy, or a copper-titanium alloy is preferably used. Chromium, nickel, titanium, aluminum, zinc, gold, palladium, silver, copper, or a nickel-chrome alloy is more preferably used. Copper is still more preferably used.

Here, an embodiment example in which the pattern conductive layer is formed on the polished surface of the cured product will be described in detail. A plating seed layer is formed on the polished surface of the cured product by non-electrolytic plating. Subsequently, an electrolytic plating layer is formed on the formed plating seed layer by electrolytic plating, and an unnecessary plating seed layer is removed by, for example, etching, if needed, so that a conductive layer having a desired circuit pattern can be formed. After the formation of the conductive layer, annealing treatment may be performed, if needed, for the purpose of, for example, enhancing the peel strength of the conductive layer. The annealing treatment can be performed by, for example, heating a circuit board at 150° C. to 200° C. for 20 to 90 minutes.

After the formation of the conductive layer, a mask pattern to cause a part of the plating seed layer to be exposed is formed on the formed plating seed layer so as to correspond to a desired wiring pattern. In this case, an electrolytic plating layer is formed on the exposed plating seed layer by electrolytic plating, and then the mask pattern is removed. Subsequently, an unnecessary plating seed layer is removed by, for example, etching to form a pattern conductive layer having a desired wiring pattern.

From the viewpoint of slimming down, the thickness of the pattern conductive layer is preferably 70 µm or less, more preferably 60 µm or less, still more preferably 50 µm or less, still more preferably 40 µm or less, and particularly preferably 30 µm or less, 20 µm or less, 15 µm or less, or 10 µm or less. The lower limit of the thickness is preferably 1 µm or more, more preferably 3 µm or more, and still more preferably 5 µm or more.

Inductor Component

An inductor component includes the circuit board of the present invention. Such inductor component has an inductor pattern formed of a conductor in at least a part of the circumference of the cured product of the through-hole filling paste. As the inductor component, for example, an inductor component described in Japanese Patent Application Laid-open No. 2016-197624, which is incorporated herein by reference in its entirety, can be applied.

The inductor component can be used as a wiring board on which an electronic component, such as a semiconductor chip, is to be mounted, or the inductor component can be used as a (multilayer) printed wiring board that uses the wiring board as an internal layer substrate. Alternatively, the inductor component can be used as a chip inductor component obtained by making the wiring board into individual pieces, or can be used as a printed wiring board onto which the chip inductor component is surface-mounted.

Using the wiring board, various types of semiconductor devices can be produced. A semiconductor device including the wiring board can be preferably used for electrical products (for example, a computer, a cellular phone, a digital camera, and a television) and vehicles (for example, a motorcycle, an automobile, a train, a ship, and an airplane).

Other features of the invention will become apparent in the course of the following descriptions of exemplary embodiments which are given for illustration of the invention and are not intended to be limiting thereof.

EXAMPLES

In the following description, "part(s)" and "%" representing an amount mean "part(s) by mass" and "% by mass", respectively, unless otherwise specified.

Example 1: Preparation of Through Hole Filling Paste 1

3.75 parts by mass of an epoxy resin (ZX-1059, a mixed product of a bisphenol A epoxy resin and a bisphenol F epoxy resin, manufactured by Nippon Steel & Sumikin Chemical Co., Ltd.), 3.28 parts by mass of a curing agent (HNA-100, an acid anhydride-based epoxy resin curing agent, manufactured by New Japan Chemical Co., Ltd.), 0.11 parts by mass of a curing agent (PN-50, an amine-based curing accelerator, manufactured by Ajinomoto Fine-Techno Co., Inc.), 0.58 parts by mass of a curing agent (2PHZ-PW, an imidazole-based curing accelerator, manufactured by SHIKOKU CHEMICALS CORPORATION), and magnetic powder (obtained by giving treatment to 60 parts by mass of AW2-08PF3F, that is, an Fe—Cr—Si-based alloy (amorphous, having an average particle diameter of 3.0 μm, manufactured by EPSON ATMIX Corporation) with 0.06 parts by mass of KBM-103 (alkoxy silane, manufactured by Shin-Etsu Chemical Co., Ltd.) were mixed and dispersed uniformly with a three-roll mill to prepare a through hole filling paste 1.

Example 2: Preparation of Through Hole Filling Paste 2

0.01 parts by mass of triethyl borate (manufactured by JUNSEI CHEMICAL CO., LTD.) was furthermore added in Example 1. A through hole filling paste 2 was prepared in the same manner as in Example 1, except the above-described operation.

Example 3: Preparation of Through Hole Filling Paste 3

8.3 parts by mass of an epoxy resin (ZX-1059, a mixed product of a bisphenol A epoxy resin and a bisphenol F epoxy resin, manufactured by Nippon Steel & Sumikin Chemical Co., Ltd.), 0.58 parts by mass of a curing agent (2PHZ-PW, an imidazole-based curing accelerator, manufactured by SHIKOKU CHEMICALS CORPORATION), and magnetic powder (obtained by giving treatment to 65 parts by mass of AW2-08PF3F, that is, an Fe—Cr—Si-based alloy (amorphous, having an average particle diameter of 3.0 μm, manufactured by EPSON ATMIX Corporation) with 0.065 parts by mass of KBM-103 (alkoxy silane, manufactured by Shin-Etsu Chemical Co., Ltd.) were mixed and dispersed uniformly with a three-roll mill to prepare a through hole filling paste 3.

Example 4: Preparation of Through Hole Filling Paste 4

0.065 parts by mass of KBM-103 (alkoxy silane, manufactured by Shin-Etsu Chemical Co., Ltd.) in Example 3 was changed to 0.065 parts by mass of ALM (an aluminate-based coupling agent, manufactured by manufactured by Ajinomoto Fine-Techno Co., Inc.). A through hole filling paste 4 was prepared in the same manner as in Example 3, except the above-described operation.

Example 5: Preparation of Through Hole Filling Paste 5

0.065 parts by mass of KBM-103 (alkoxy silane, manufactured by Shin-Etsu Chemical Co., Ltd.) in Example 3 was changed to 0.065 parts by mass of TTS (a titanate-based coupling agent, manufactured by manufactured by Ajinomoto Fine-Techno Co., Inc.). A through hole filling paste 5 was prepared in the same manner as in Example 3, except the above-described operation.

Example 6: Preparation of Through Hole Filling Paste 6

0.008 parts by mass of triethyl borate (manufactured by JUNSEI CHEMICAL CO., LTD.) was furthermore added in Example 3. A through hole filling paste 6 was prepared in the same manner as in Example 3, except the above-described operation.

Example 7: Preparation of Through-Hole Filling Paste 7

8.3 parts by mass of an epoxy resin (ZX-1059, a mixed product of a bisphenol A epoxy resin and a bisphenol F epoxy resin, manufactured by Nippon Steel & Sumikin Chemical Co., Ltd.), 0.58 parts by mass of a curing agent (2PHZ-PW, an imidazole-based curing accelerator, manufactured by SHIKOKU CHEMICALS CORPORATION), and magnetic powder (obtained by giving treatment to 33 parts by mass of BSN-125 (ferrite-based magnetic powder, having an average particle diameter of 7.6 μm, manufactured by TODA KOGYO CORP) with 0.033 parts by mass of KBM-103 (a silane-based coupling agent, manufactured by Shin-Etsu Chemical Co., Ltd.) were mixed and dispersed uniformly with a three-roll mill to prepare a through hole filling paste 7.

Example 8: Preparation of Through Hole Filling Paste 8

0.008 parts by mass of triethyl borate (manufactured by JUNSEI CHEMICAL CO., LTD.) was furthermore added in Example 7. A through hole filling paste 8 was prepared in the same manner as in Example 7, except the above-described operation.

Comparative Example 1: Preparation of Through Hole Filling Paste 9

The magnetic powder was not treated with 0.06 parts by mass of KBM-103 (alkoxy silane, manufactured by Shin-Etsu Chemical Co., Ltd.) in Example 1. A through hole filling paste 9 was prepared in the same manner as in Example 1, except the above-described operation.

Comparative Example 2: Preparation of Through Hole Filling Paste 10

The magnetic powder was not treated with 0.065 parts by mass of KBM-103 (alkoxy silane, manufactured by Shin-Etsu Chemical Co., Ltd.) in Example 3. A through hole filling paste 10 was prepared in the same manner as in Example 3, except the above-described operation.

Measurement of Relative Magnetic Permeability and Magnetic Loss

As a support, a polyethylene terephthalate (PET) film (PET501010, manufactured by LINTEC Corporation, having a thickness of 50 μm) having been subjected to treatment with a silicone resin-based release agent was prepared. Each of the through hole filling pastes 1 to 10 respectively produced in Examples and Comparative Examples was uniformly applied onto a release surface of the PET film by a doctor blade so as to have a paste layer thickness of 50 μm after drying, so that a resin sheet was obtained. The obtained resin sheet was heated at 180° C. for 90 minutes to thermally cure the paste layer, and the support was detached from the resin sheet to obtain a cured product in a sheet form. The obtained cured product was cut into a test piece having a width of 5 mm and a length of 18 mm to obtain an evaluation sample. The relative magnetic permeability (μ') and the magnetic loss (μ") of the evaluation sample were measured at a room temperature of 23° C. and a measurement frequency of 10 MHz by a three-turn coil method using HP8362B (trade name), manufactured by Agilent Technologies, Ltd.

Evaluation of Adhesion Strength to Plating Copper

Both surfaces of a double-sided copper clad laminate with an epoxy resin-glass cloth base material (R5715ES, manufactured by Matsushita Electric Works, Ltd., having a copper foil thickness of 18 μm and a substrate thickness of 0.3 mm) were etched to a depth of 1 μm by using a micro-etching agent (CZ8100, manufactured by MEC COMPANY LTD.), whereby the copper surfaces were roughened to prepare an internal layer substrate.

Each of the through hole filling pastes 1 to 10 respectively produced in Examples and Comparative Examples was uniformly applied onto the internal layer substrate by a doctor blade so as to have a paste layer thickness of 50 μm after drying, so that a resin layer was formed. The paste layer was heated at 130° C. for 30 minutes and furthermore heated at 150° C. for 30 minutes to be thermally cured, so that a cured product layer was formed. A surface of the formed cured product layer was subjected to buffing, and then subjected to thermally treatment by heating at 180° C. for 30 minutes.

The internal layer substrate in which the surface of the cured product layer had been subjected to buffing was immersed in a non-electrolytic plating solution containing $PdCl_2$ at 40° C. for 5 minutes, and subsequently immersed in an electrolytic plating solution at 25° C. for 20 minutes. After performing annealing treatment by heating at 150° C. for 30 minutes, copper sulfate electrolytic plating was performed to form a conductive layer having a thickness of 30 μm on the cured product layer. Next, annealing treatment was performed at 180° C. for 60 minutes. This substrate was used as an evaluation substrate.

A cut was made in a portion, having a width of 10 mm and a length of 100 mm, of the evaluation substrate, one end thereof was peeled, and grasped by a grasping tool (an autocom type testing instrument, AC-50C-SL, manufactured by TSE Co., Ltd.), and a load (kgf/cm) at the time of peeling to an extent of 35 mm in a vertical direction at a speed of 50 ram/min at room temperature was measured. In the case where a numerical value of the load was not acquired appropriately, a classification was made in accordance with the following evaluation criteria.

Peel: Due to too low adhesion strength, an appropriate load could not be applied at the time of measurement, and, as a result, the measurement became difficult.

Blister: Blisters developed in the conductive layer after electrolytic plating treatment, and accordingly measurements could not be performed.

TABLE 1

| | | Example | | | | | | | | Comparative Example | |
|---|---|---|---|---|---|---|---|---|---|---|---|
| | | 1 | 2 | 3 | 4 | 5 | 6 | 7 | 8 | 1 | 2 |
| Magnetic powder | AW2-08PF3F | 60 | 60 | 65 | 65 | 65 | 65 | | | 60 | 65 |
| | BSN-125 | | | | | | | 33 | 33 | | |
| Surface treating agent | KBM-103 | 0.060 | 0.060 | 0.065 | | | 0.065 | 0.033 | 0.033 | | |
| | ALM | | | | 0.065 | | | | | | |
| | TTS | | | | | 0.065 | | | | | |
| Epoxy resin | ZX-1059 | 3.75 | 3.75 | 8.30 | 8.30 | 8.30 | 8.30 | 8.30 | 8.30 | 3.75 | 8.30 |
| Curing agent | HNA-100 | 3.28 | 3.28 | | | | | | | 3.28 | |
| | PN-50 | 0.11 | 0.11 | | | | | | | 0.11 | |
| | 2PHZ-PW | 0.58 | 0.58 | 0.58 | 0.58 | 0.58 | 0.58 | 0.58 | 0.58 | 0.58 | 0.58 |
| Other additives | B(OEt)$_3$ | | 0.010 | | | | 0.008 | | 0.008 | | |
| Total content (parts) | | 67.78 | 67.79 | 73.95 | 73.95 | 73.95 | 73.95 | 41.91 | 41.92 | 67.72 | 73.88 |
| Solid content (parts) | | 67.78 | 67.79 | 73.95 | 73.95 | 73.95 | 73.95 | 41.91 | 41.92 | 67.72 | 73.88 |
| Resin component content (parts) | | 7.78 | 7.79 | 8.95 | 8.95 | 8.95 | 8.95 | 8.91 | 8.92 | 7.72 | 8.88 |
| Magnetic powder content (% by mass) | | 88.50 | 88.50 | 87.90 | 87.90 | 87.90 | 87.89 | 78.73 | 78.72 | 88.60 | 87.98 |
| Curing accelerator content (% by mass) | | 8.87 | 8.86 | 6.48 | 6.48 | 6.48 | 6.48 | 6.51 | 6.50 | 8.94 | 6.53 |
| Relative magnetic permeability (at 100 MHz) | | 7.8 | 7.7 | 6.5 | 6.5 | 6.4 | 6.4 | 5.1 | 5.1 | 6.5 | 5.0 |
| Magnetic loss (at 100 MHz) | | 0.27 | 0.26 | 0.23 | 0.22 | 0.22 | 0.22 | 0.18 | 0.17 | 0.23 | 0.18 |
| Adhesion strength to plating copper (kgf/cm) | | 0.3 | 0.3 | 0.3 | 0.3 | 0.3 | 0.3 | 0.2 | 0.2 | peel | blister |

Manufacture of Circuit Board

A double-sided copper clad laminate with an epoxy resin-glass cloth base material (R5715ES, manufactured by Matsushita Electric Works, Ltd., having a copper foil thickness of 18 μm and a substrate thickness of 0.3 mm) was prepared as an internal layer substrate.

Through holes each having a diameter of 0.35 mm were formed at 1-mm pitch in the internal layer substrate, and then, a roughening step was carried out. The roughening step was carried out in such a manner that the internal layer substrate was immersed in a swelling liquid, Swelling Dip Securiganth P, containing diethylene glycol monobutyl ether, manufactured by Atotech Japan K. K., at 60° C. for 5 minutes. Subsequently, the internal layer substrate was immersed in a roughening solution, Concentrate Compact P (an aqueous solution of 60 g/L of $KMnO_4$ and 40 g/L of NaOH), manufactured by Atotech Japan K. K., at 80° C. for 10 minutes. After washed with water, the internal layer substrate was finally immersed in a neutralization solution, Reduction Solution Securiganth P, manufactured by Atotech Japan K. K., at 40° C. for 5 minutes. After that, the internal layer substrate was dried at 130° C. for 15 minutes. Thus, walls of the through holes were roughened and a smear was removed therefrom.

Next, the internal layer substrate was immersed in a $PdCl_2$-containing non-electrolytic plating solution at 40° C. for 5 minutes, and then, immersed in a non-electrolytic copper plating solution at 25° C. for 20 minutes. After performing annealing treatment by heating at 150° C. for 30 minutes, copper sulfate electrolytic plating was performed. Subsequently, annealing treatment was performed at 190° C. for 60 minutes to form a plating layer in the through holes, whereby a through hole substrate was obtained.

The through hole filling paste 1 prepared in Example 1 was printed on the through hole substrate, and the through holes were filled with the through hole filling paste 1, so that a paste layer was formed. After the paste layer was formed, the through hole substrate was heated at 130° C. for 30 minutes, and further heated at 150° C. for 30 minutes.

Next, surfaces of the paste layer and a surface of the through hole substrate was subjected to buffing. Furthermore, the through hole substrate was heated at 180° C. for 30 minutes to thermally cure the paste layer, so that a cured product layer was obtained.

The through hole substrate was immersed in a $PdCl_2$-containing non-electrolytic plating solution at 40° C. for 5 minutes. Subsequently, the through hole substrate was immersed in a non-electrolytic copper plating solution at 25° C. for 20 minutes. After performing annealing treatment by heating at 150° C. for 30 minutes, copper sulfate electrolytic plating was performed to form a conductive layer having a thickness of 30 μm on the cured product layer. Subsequently, annealing treatment was performed at 180° C. for 60 minutes. Subsequently, an etching resist was formed and patterned by etching to obtain a circuit board.

This circuit board had neither a peeled portion nor a blister at an interface between a surface of the cured product layer and the conductive layer, and was excellent in plating adhesion.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A through hole filling paste, comprising:
   (A) at least one magnetic powder;
   (B) at least one epoxy resin; and
   (C) at least one curing agent,
   wherein said at least one magnetic powder (A) is surface treated with a surface treating agent containing at least one element selected from the group consisting of Si, Al, and Ti.

2. The through hole filling paste according to claim 1, wherein said surface treatment agent is at least one member selected from the group consisting of an alkoxy silane, a silane-based coupling agent, an aluminate-based coupling agent, and a titanate-based coupling agent.

3. The through hole filling paste according to claim 1, wherein said at least one magnetic powder (A) is at least one member selected from the group consisting of an iron oxide powder and an iron alloy-based metal powder.

4. The through hole filling paste according to claim 1, wherein said at least one magnetic powder (A) has an average particle diameter of 0.01 μm to 10 μm.

5. The through hole filling paste according to claim 1, wherein said at least one magnetic powder (A) has an aspect ratio of 2 or less.

6. The through hole filling paste according to claim 1, wherein said at least one magnetic powder (A) is present in an amount of 70% by mass to 98% by mass, based on 100% by mass of non-volatile components in the through hole filling paste.

7. The through hole filling paste according to claim 1, wherein said at least one magnetic powder (A) is an iron oxide powder, said iron oxide powder being ferrite containing at least one metal selected from the group consisting of Ni, Cu, Mn, and Zn.

8. The through hole filling paste according to claim 1, wherein said at least one magnetic powder (A) is an iron alloy-based metal powder containing at least one metal selected from the group consisting of Si, Cr, Al, Ni, and Co.

9. The through hole filling paste according to claim 1, wherein said at least one epoxy resin (B) comprises an epoxy resin that remains liquid at 25° C.

10. The through hole filling paste according to claim 1, wherein said at least one curing agent (C) is at least one member selected from the group consisting of an acid anhydride-based epoxy resin curing agent, an amine-based curing accelerator, and an imidazole-based curing accelerator.

11. A circuit board, comprising a substrate in which a through hole is filled with a cured product of a through hole filling paste according to claim 1.

12. An inductor component, comprising a circuit board according to claim 11.

13. A method for producing a circuit board, said method comprising:
   (1) filling a through hole with a through hole filling paste and thermally curing said through hole filling paste to obtain a cured product;
   (2) polishing a surface of said cured product, to obtain a polished surface; and
   (3) forming a conductive layer on said polished surface of said cured product, in an order of the step (1), the step (2), and the step (3), wherein said through hole filling paste comprises:

(A) at least one magnetic powder;

(B) at least one epoxy resin; and (C) at least one curing agent (C), wherein said at least one magnetic powder (A) is surface-treated with a surface treating agent containing at least one element selected from the group consisting of Si, Al, and Ti.

14. The method according to claim 13, wherein said surface treatment agent is at least one member selected from the group consisting of an alkoxy silane, a silane-based coupling agent, an aluminate-based coupling agent, and a titanate-based coupling agent.

15. The method according to claim 13, which does not include roughening said polished surface of said cured product after step (2) and before step (3).

* * * * *